(12) United States Patent
Ahn et al.

(10) Patent No.: US 11,201,272 B2
(45) Date of Patent: Dec. 14, 2021

(54) OPTICAL DEVICE PACKAGE (71) Applicant: POINT ENGINEERING CO., LTD., Asan (KR)

(72) Inventors: Bum Mo Ahn, Suwon (KR); Seung Ho Park, Hwaseong (KR); Moon Hyun Kim, Ansan (KR)

(73) Assignee: POINT ENGINEERING CO., LTD., Asan (KR)

( * ) Notice: Subject to any disclaimer, the term of this patent is extended or adjusted under 35 U.S.C. 154(b) by 307 days.

(21) Appl. No.: 16/383,462

(22) Filed: Apr. 12, 2019

(65) Prior Publication Data
US 2019/0319178 A1 Oct. 17, 2019

(30) Foreign Application Priority Data
Apr. 13, 2018 (KR) .................. 10-2018-0043537

(51) Int. Cl.
*H01L 33/62* (2010.01)
*H01L 25/13* (2006.01)
*H01L 33/60* (2010.01)

(52) U.S. Cl.
CPC .............. *H01L 33/62* (2013.01); *H01L 25/13* (2013.01); *H01L 33/60* (2013.01)

(58) Field of Classification Search
CPC ....................................................... H01L 33/62
See application file for complete search history.

(56) References Cited

U.S. PATENT DOCUMENTS

2015/0138656 A1*  5/2015  Ahn ................. G02B 7/02
359/811

FOREIGN PATENT DOCUMENTS

| KR | 1020130036617 A | 4/2013 |
|----|-----------------|--------|
| KR | 20150075418 A   | 7/2015 |
| KR | 1020160038568 A | 7/2016 |

* cited by examiner

Primary Examiner — Marvin Payen (57) ABSTRACT

The present invention relates generally to an optical device package on which an optical device is mounted and, more particularly, to an optical device package that is configured such that a unit substrate of the optical device package comes into surface contact with a curved surface of a light transmission member.

4 Claims, 6 Drawing Sheets

OPTICAL DEVICE PACKAGE

CROSS REFERENCE TO RELATED APPLICATION

The present application claims priority to Korean Patent Application No. 10-2018-0043537, filed Apr. 13, 2018, the entire contents of which is incorporated herein for all purposes by this reference.

BACKGROUND OF THE INVENTION

Field of the Invention

The present invention relates to an optical device package on which an optical device is mounted.

Description of the Related Art

An optical device refers to a device that generates light in response to application of an electrical signal. A light emitting diode (LED) of the optical device is not only more efficient than conventional optical devices, but also generates light of high luminance and thus is widely used in the display field.

An optical device such as an LED is mounted and used in an optical device package. A recent example of a patent on such an optical device package is disclosed in Korean Patent Application Publication No. 10-2015-0075418 (hereinafter referred to as "Patent Document 1").

A chip substrate disclosed in Patent Document 1 includes: a conductive layer laminated in one direction and constituting the chip substrate; an insulating layer alternately laminated with the conductive layer and electrically isolating the conductive layer; and a lens insert having a groove that has a predetermined depth from an upper surface of the chip substrate to a region thereof including the insulating layer, and having a predetermined number of sides on the upper surface thereof such that an arc is formed in a region where the sides meet each other.

However, the chip substrate disclosed in Patent Document 1 is problematic in that the upper surface of the chip substrate has a linear shape and thus a light transmission member having a curved surface may be not easily bonded to the chip substrate. In other words, since the light transmission member has the curved surface, a region where a part of the upper surface of the chip substrate is not in contact with the curved surface of the light transmission member may be generated. Due to this, the light transmission member and the chip substrate tend to be not easily bonded together.

The foregoing is intended merely to aid in the understanding of the background of the present invention, and is not intended to mean that the present invention falls within the purview of the related art that is already known to those skilled in the art.

DOCUMENTS OF RELATED ART (Patent document 1) Korean Patent Application Publication No. 10-2015-0075418

SUMMARY OF THE INVENTION

Accordingly, the present invention has been made keeping in mind the above problems occurring in the related art, and an objective of the present invention is to provide an optical device package that is configured such that a unit substrate of the optical device package comes into surface contact with a curved surface of a light transmission member.

In order to achieve the above objective, according to one aspect of the present invention, there is provided an optical device package that is capable of being bonded to a light transmission member having a curved surface, the optical device package including: a unit substrate including first and second metal substrates that are bonded together on side surfaces thereof in a horizontal direction, and a vertical insulating layer provided between the first and second metal substrates so as to electrically insulate the first and second metal substrates from each other; and a cavity provided in an upper surface of the unit substrate, wherein the unit substrate has a first curved surface provided on the upper surface thereof and coming into surface contact with the light transmission member.

Furthermore, the first curved surface may be shaped to be convex downward.

Furthermore, the first curved surface may be shaped to be convex upward.

Furthermore, the unit substrate may have a second curved surface provided on a lower surface thereof and having the same curvature as a curvature of the first curved surface.

Furthermore, the cavity may be disposed such that a center point thereof is located on a center point of the first curved surface.

According to another aspect of the present invention, there is provided an optical device package that is capable of being bonded to a light transmission member having a curved surface, the optical device package including: a unit substrate including first and second metal substrates that are bonded together on side surfaces thereof in a horizontal direction, a vertical insulating layer provided between the first and second metal substrates so as to electrically insulate the first and second metal substrates from each other, and a first curved surface provided on an upper surface thereof and coming into surface contact with the light transmission member; and a cavity provided in the upper surface of the unit substrate, wherein multiple unit substrates are connected to each other, and each of junctions between the multiple unit substrates has a groove that is formed in a lower surface of the unit substrate to be open downward.

The optical device package according to the present invention as described above has the following effects.

Through provision of the first curved surface, the upper surface of the optical device package has a shape corresponding to the shape of the curved surface of the light transmission member. This makes it possible for the optical device package to be bonded to the light transmission member in surface contact therewith. Therefore, it is possible to prevent defective bonding, leakage of light, and the like that may be caused when a portion of the optical device package is not in contact with the light transmission member.

The optical device package has a configuration in which provision of a light transmission member bonded to the upper surface of an optical device package according to the related art is eliminated, and the surface of the optical device package that is to come into direct contact with the light transmission member having the curved surface is changed to the first curved surface. Therefore, it is possible to prevent the transmittance from being decreased due to the light transmission member of the optical device package according to the related art when light generated in the optical device is radiated, and also to prevent the optical device from being damaged due to penetration of foreign substances such as water into the cavity.

Through provision of the second curved surface, the lower surface of the optical device package has a shape corresponding to the shapes of the curved surface of the light transmission member and the first curved surface. Therefore, when the optical device package, the light transmission member, and an electrode part are all combined, it is possible to easily maintain the overall shape in a curved shape.

The multiple unit substrates are bonded to the light transmission member in a state of being rolled in a circular shape by the grooves, thus making it possible to easily achieve surface contact bonding to the curved surface of the light transmission member, and also to efficiently bond a large number of unit substrates to the light transmission member.

The multiple unit substrates are connected to each other, thus making it possible to achieve a strong bonding between the light transmission member and the optical device package.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to such specifically listed exemplary embodiments and conditions.

The above described objectives, features, and advantages will be more apparent through the following detailed description related to the accompanying drawings, and thus those of ordinary skill in the art may easily implement the technical spirit of the invention.

In the following description, the X-axis denotes an axis that connects the left side and the right side of an optical device package 10 of FIG. 1, and the Y-axis denotes an axis that is perpendicular to the X-axis and connects the front side and the rear side of the optical device package 10 of FIG. 1.

Figure 1:
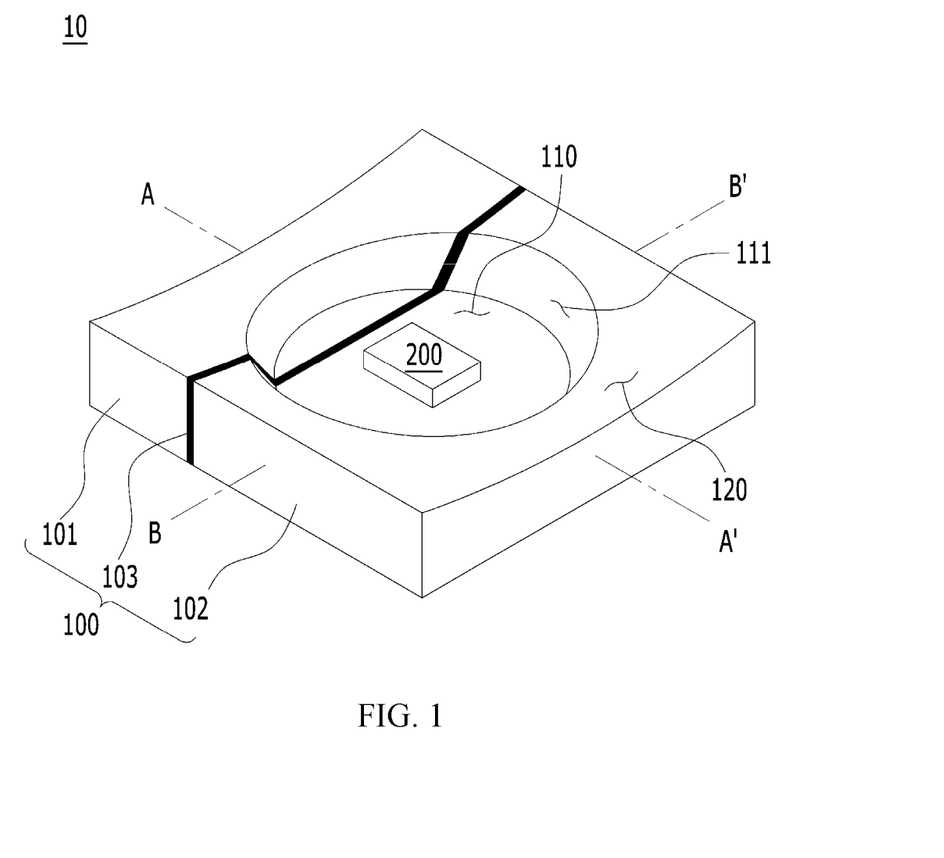
FIG. 1 is a perspective view illustrating that an optical device is mounted on an optical device package according to a first embodiment of the present invention.

Therefore, a direction from the left side to the right side of the optical device package 10 of FIG. 1, that is, a direction in which line A-A' is drawn is an X-axis direction, and a direction from the front side to the rear side, that is, line B-B' is drawn is an Y-axis direction.

Figure 2A:
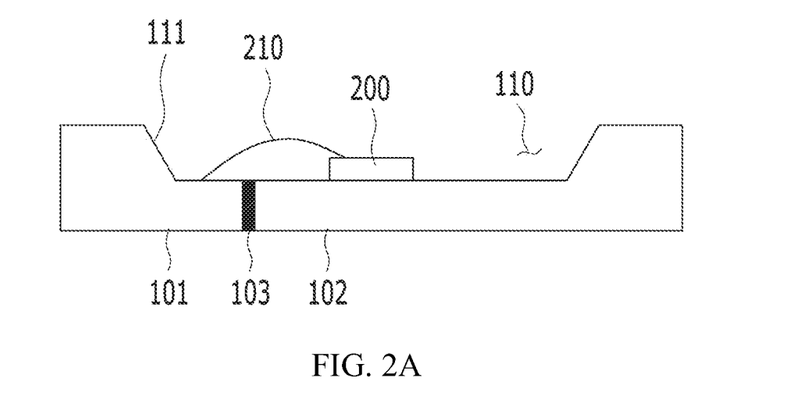
FIG. 2A is a cross-sectional view taken along line A-A' of FIG. 1.
Figure 4:
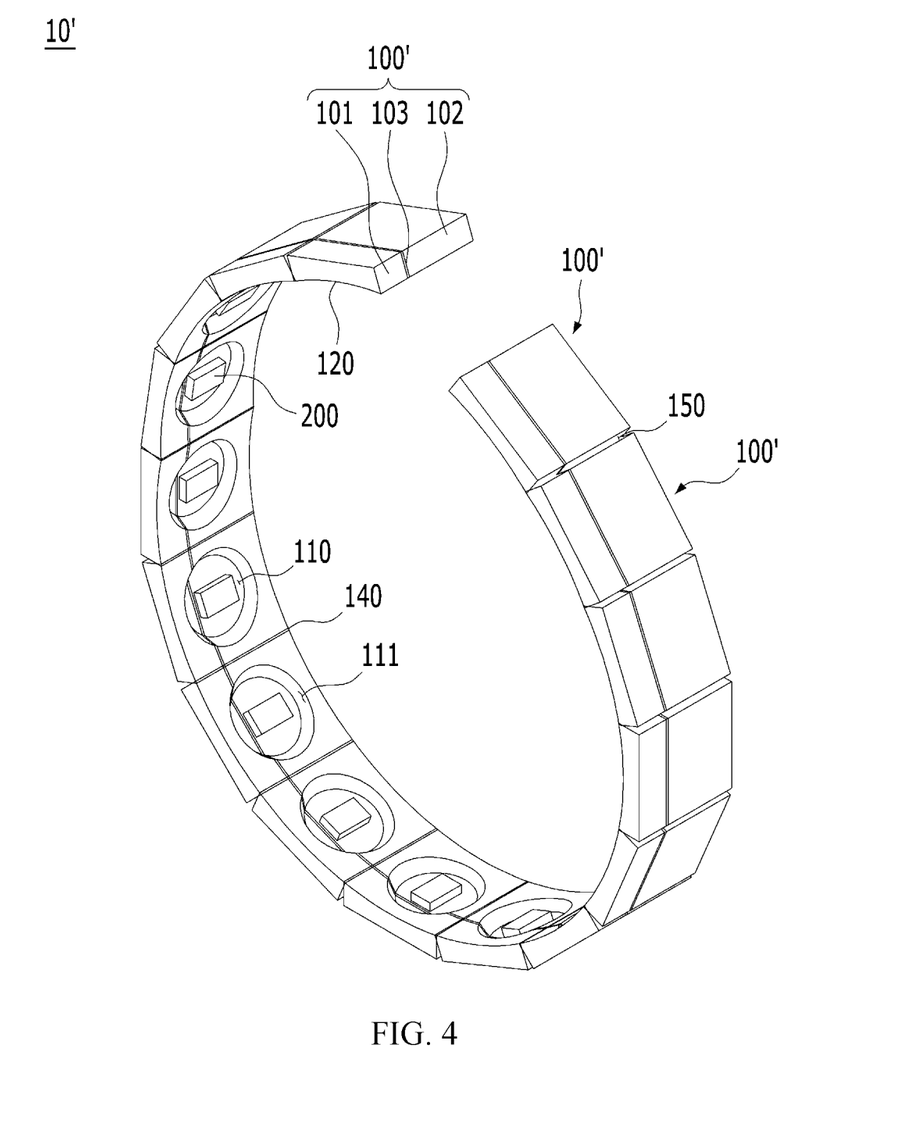
FIG. 4 is a perspective view illustrating that an optical device is mounted on an optical device package according to a second embodiment of the present invention.
Figure 5A:
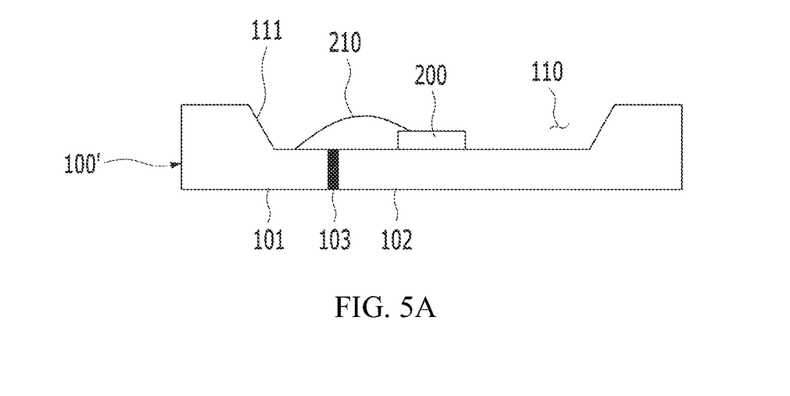
FIG. 5A is a sectional view taken along an X-axis of the optical device package of FIG. 4.

FIG. 1 is view in which a wire 210 of FIG. 2A is not illustrated, and FIG. 4 is a view in which a wire 210 of FIG. 5A is not illustrated.

Optical Device Package 10 According to a First Embodiment of the Present Invention Hereinbelow, an optical device package 10 according to a first embodiment of the present invention will be described with reference to FIGS. 1 to 3.

Figure 2B:
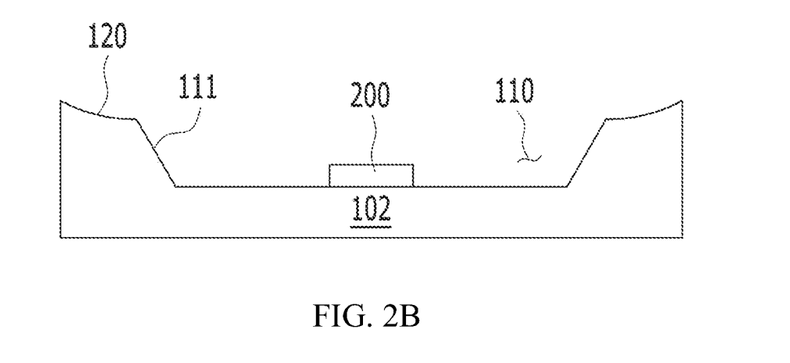
FIG. 2B is a cross-sectional view taken along line B-B' of FIG. 1.
Figure 3:
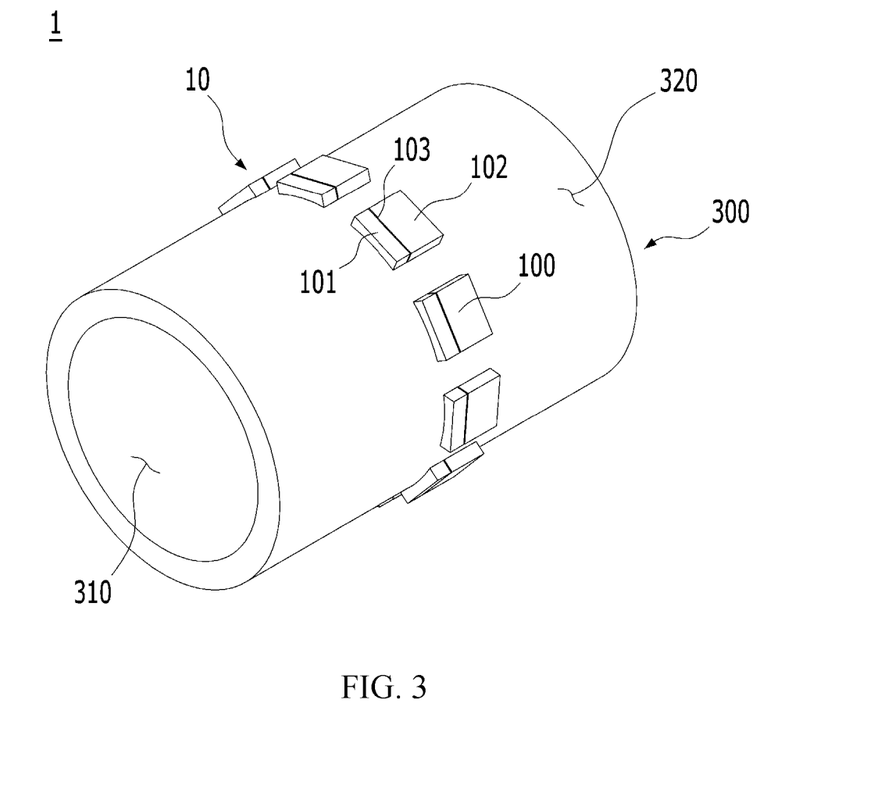
FIG. 3 is a perspective view illustrating that the optical device package of FIG. 1 is bonded to a light transmission member having a curved surface.

FIG. 1 is a perspective view illustrating that an optical device is mounted on an optical device package according to a first embodiment of the present invention, FIG. 2A is a cross-sectional view taken along line A-A' of FIG. 1, FIG. 2B is a cross-sectional view taken along line B-B' of FIG. 1, and FIG. 3 is a perspective view illustrating that the optical device package of FIG. 1 is bonded to a light transmission member having a curved surface.

As illustrated in FIGS. 1, 2A, and 2B, the optical device package 10 according to the first preferred embodiment of the present invention includes: a unit substrate 100 having first and second metal substrates 101 and 102 that are bonded together on side surfaces thereof in a horizontal direction, and a vertical insulating layer 103 provided between the first and second metal substrates 101 and 102 so as to electrically insulate the first and second metal substrates 101 and 102 from each other; a cavity 110 provided in an upper surface of the unit substrate 100; and a first curved surface 120 provided on the upper surface of the unit substrate 100.

The unit substrate 100 includes the first metal substrate 101, the second metal substrate 102, and the vertical insulating layer 103.

As illustrated in FIG. 2A, the first metal substrate 101 and the second metal substrate 102 are bonded together on a right surface and a left surface thereof, respectively, by the vertical insulating layer 103. Therefore, the first metal substrate 101, the vertical insulating layer 103, and the second metal substrate 102 are sequentially arranged from the left to the right.

The first metal substrate 101 and the second metal substrate 102 are made of a metal plate having excellent electrical conductivity and thermal conductivity. For example, the first metal substrate 101 and the second metal substrate 102 are made of any one selected from among the group consisting of aluminum, an aluminum alloy, copper, a copper alloy, iron, an iron alloy, and the like, but are not limited thereto.

Although not illustrated in the drawings, each of the first metal substrate 101 and the second metal substrate 102 has an electrode layer provided at a lower portion thereof. The electrode layer is made by plating of a metal material or the like and is connected to a circuit board or to a power source to apply voltage to the first and second metal substrates 101 and 102.

The vertical insulating layer 103 is vertically disposed between the first metal substrate 101 and the second metal substrate 102 and functions to electrically insulate the first metal substrate 101 and the second metal substrate 102 from each other and to bond the first metal substrate 101 and the second metal substrate 102 together.

The first metal substrate 101 and the second metal substrate 102 are electrically insulated from each other by the vertical insulating layer, whereby different voltages are applied to the first metal substrate 101 and the second metal substrate 102.

The vertical insulating layer 103 is made of any one selected from among the group consisting of a conventional insulating sheet, benzocyclobutene (BCB), bismaleimide trizine (BT), polybenzoxazole (PBO), polyimide (PI), phenolicresin, epoxy, silicone, and the like, but is not limited thereto.

In the case where the first and second metal substrates 101 and 102 are made of aluminum or an aluminum alloy, the vertical insulating layer 103 includes an aluminum anodic oxide film formed by anodic oxidation of aluminum.

The cavity 110 is depressed downward in the upper surface of the unit substrate 100 so as to be located at the center of the unit substrate 100 and provides a space for mounting the optical device 200 therein.

The cavity 110 has a tapered bowl shape configured such that the width thereof decreases downward. Therefore, the cavity 110 is provided with an inclined surface 111, and the inclined surface 111 is inclined inwardly from the top of the unit substrate 100.

Due to the tapered bowl shape of the cavity 110, the lower width of the cavity 110 is smaller than the upper width thereof.

The inclined surface 111 functions to reflect light generated in the optical device 200 mounted in the cavity 110. Therefore, when the optical device 200 is mounted in the cavity 110, light efficiency of light generated in the optical device 200 is further increased.

The cavity 110 having the above-described configuration is formed by forming or the like of the upper surface of the unit substrate 100. Therefore, the cavity 110 is depressed downwardly of the first and second metal substrates 101 and 102 by forming or the like of a part of an upper surface of the first metal substrate 101 and a part of an upper surface of the second metal substrate 102. Furthermore, the cavity 110 is formed by removing a part of an upper portion of the vertical insulating layer 103 disposed between the first and second metal substrates 101 and 102.

The first curved surface 120 is formed on the upper surface of the unit substrate 100 and functions to allow the upper surface of the unit substrate 100 of the optical device package 10 to come into surface contact with a curved surface 320 of a light transmission member 300 when the optical device package 10 is bonded to the light transmission member 300.

The first curved surface 120 is formed on the upper surface of the unit substrate 100, that is, on the upper surfaces of the first and second metal substrates 101 and 102 by forming or the like.

It is preferable that the first curved surface 120 is the same in curvature as the curved surface 320 of the light transmission member 300. This is to allow the first curved surface 120 to entirely come into surface contact with the curved surface 320 of the light transmission member 300.

The first curved surface 120 is shaped to be convex downwardly of the unit substrate 100 or convex upwardly of the unit substrate 100 depending on the position of the optical device package 10 provided on the light transmission member 300. In FIGS. 1, 2A, and 2B, the first curved surface 120 is convex downwardly of the unit substrate 100. Therefore, as illustrated in FIG. 3, the optical device package 10 is provided so as to be in surface contact with an outer surface of the light transmission member 300.

The first curved surface 120 is formed on any one of the surface parallel to the X-axis of the unit substrate 100 and the surface parallel to the Y-axis thereof. In FIGS. 1, 2A, and 2B, the first curved surface 120 is formed on the surface parallel to the Y-axis of the unit substrate 100. The provision of the first curved surface 120 ensures that when the optical device package 10 is provided on the light transmission member 300 having a substantially cylindrical shape as illustrated in FIG. 3, the surface contact between the first curved surface 120 and the light transmission member 300 is more easily achieved.

It is preferable that the center point of the first curved surface 120 is coaxially located with the center point of the unit substrate 100. Furthermore, it is preferable that the center point of the cavity 110 is located on the center point of the first curved surface 120.

Due to the fact that the first curved surface 120 and the cavity 110 are formed to have the above-described formation positions, the cavity 110 is located at the center of the unit substrate 100, and also the lowest point of the first curved surface 120 (in the case where the first curved surface 120 is convex downwardly of the unit substrate 100) or the uppermost point of the first curved surface 120 (in the case where the first curved surface 120 is convex upwardly of the unit substrate 100) is located on the center point of at least one of the X-axis and the Y-axis of the unit substrate 100.

The above-described configuration ensures that even if multiple optical device packages 10 are provided on the light transmission member 300, when the optical device 200 is mounted at the center of the cavity 110 of each of the optical device packages 10, light emitted from the optical devices 200 mounted on the optical device packages is emitted such that the directions of the light are all toward the central axis of the light transmission member 300.

The optical device package 10 having the above-described configuration has the optical device 200 mounted thereon, and the optical device package 10 having the optical device 200 mounted thereon is shown in FIGS. 1, 2A, and 2B.

The optical device 200 is mounted in the cavity 110, and the optical device 200 mounted in the cavity 110 is illuminated in response to application of voltage, thus functioning as a light emitter.

The optical device 200 may be a conventional light emitting diode (LED), but the type of the optical device 200 is not limited thereto.

Furthermore, light generated in the optical device 200 may be any one of visible light, infrared light, and ultraviolet light.

The optical device 200 is located on the second metal substrate 102, whereby voltage applied to the second metal substrate 102 is directly applied to the optical device 200 being in contact with the second metal substrate 102.

The optical device 200 is connected to the first metal substrate 101 through a wire 210, whereby voltage applied to the first metal substrate 101 is applied to the optical device 200.

The above-described configuration ensures that when voltages of different polarities are applied to the first and second metal substrates 101 and 102, the voltages of different polarities are also applied to the optical device 200, whereby the optical device 200 emits light.

For example, when a positive (+) voltage is applied to the first metal substrate 101 and a negative (−) voltage is applied to the second metal substrate 102, the positive (+) voltage is applied to the optical device 200 through the wire 210 and the negative (−) voltage is applied to the optical device 200 through direct connection between the second metal substrate 102 and the optical device 200.

The optical device package 10 having the optical device 200 mounted thereon is provided in surface contact with the light transmission member 300 having a curved surface, and the optical device package 10 thus provided in surface contact with the light transmission member 300 having the curved surface is illustrated in FIG. 3.

The first curved surface 120 of the optical device package 10 is configured such that a metal surface of the first metal substrate 101 or the second metal substrate 102 remains exposed, or a separate metal plated layer is formed.

The cavity 110 is provided with a metal pad for facilitating bonding of the optical device 200 on a bottom surface thereof on which the optical device 200 is mounted.

The light transmission member 300 has a passage 310 formed therein and has the curved surface 320. In this case, it is preferable that the curved surface 320 is the same in curvature as the first curved surface 120.

It is preferable that the light transmission member 300 is made of a material having excellent translucency such that light emitted from the optical device 200 of the optical device package 10 is transmitted without being scattered. For example, the light transmission member 300 is any one selected from among the group consisting of glass, quartz, and the like, but is not limited thereto.

As described above, when the first curved surface 120 is convex downwardly of the optical device package 10, that is, the unit substrate 100, the optical device package 10 is provided in surface contact with the outer surface of the light transmission member 300.

Multiple optical device packages 10 are arranged on the outer surface of the light transmission member 300. As illustrated in FIG. 3, the optical device packages 10 are arranged on a circumferential surface, that is, an outer circumferential surface of the light transmission member 300 along a circumferential direction thereof.

As described above, the optical device packages 10 are provided in surface contact with the outer surface of the light transmission member 300, whereby when light is emitted from optical devices 200 of the optical device packages 10, the light is emitted into the passage of the light transmission member 300.

Therefore, in the case where the optical devices 200 are light emitters that emit ultraviolet light and a fluid flows through the passage 310 of the light transmission member 300, ultraviolet light generated by the optical devices 200 is radiated to the fluid, thus sterilizing the fluid.

In the optical device package 10 according to the first embodiment of the present invention having the above-described configuration, the first curved surface 120 is formed on the upper surface of the unit substrate 100, whereby the upper surface has a shape corresponding to the shape of the curved surface 320 of the light transmission member 320. This makes it possible for the light transmission member 300 and the optical device package 10 to be bonded together such that the optical device package 10 comes into surface contact with the light transmission member 300.

Therefore, unlike an optical device package according to the related art, it is possible to prevent defective bonding, leakage of light, and the like that may be caused when a portion of the optical device package is not in contact with the light transmission member.

The optical device package 10 according to the first embodiment of the present invention has a configuration in which provision of a light transmission member bonded to the upper surface of the optical device package according to the related art is eliminated, and the surface (that is, the upper surface of the optical device package 10) that is to be in direct contact with the light transmission member 300 having the curved surface 320 is changed to the first curved surface 120. Therefore, it is possible to prevent the transmittance from being decreased due to the light transmission member of the optical device package according to the related art when light generated in the optical device is radiated.

Described in detail, in the case where the optical device is an ultraviolet optical device that generates ultraviolet light, and when the light transmission member is made of quartz, the transmittance of the ultraviolet light radiated from the ultraviolet optical device is decreased by the transmittance of the light transmission member. As in the related art, in the case where a light transmission member is bonded to the optical device package, and a light transmission member having a curved surface is further bonded to the upper surface of the light transmission member, the transmittance of ultraviolet light radiated from the ultraviolet optical device is significantly decreased. However, in the case of the optical device package 10 according to the first embodiment of the present invention, the curved surface 320 of the light transmission member 300 and the first curved surface 120 come into surface contact with each other, thus eliminating requirement of a separate light transmission member to be bonded. This makes it possible to prevent the transmittance of light generated in the optical device from being decreased.

Furthermore, due to the fact that the curved surface 320 of the light transmission member 300 and the first curved surface 120 come into surface contact with each other, the light transmission member 300 and the optical device package 10 are bonded together in close contact with each other. This makes it possible to effectively prevent foreign substances such as water or the like from penetrating into the cavity 110. Therefore, the present invention provides an excellent effect in terms of protection of the optical device 200 mounted on the optical device package 10.

Unlike the above description and unlike as illustrated in FIG. 3, the optical device package 10 may also be mounted on an inner surface of the light transmission member 300. In this case, the first curved surface 120 may be formed to be convex upwardly of the optical device package 10, that is, the unit substrate 100. When the first curved surface 120 is formed in such a shape, the optical device package 10 is provided in surface contact with the inner surface of the curved surface 320 of the light transmission member 300.

The unit substrate 100 of the optical device package 10 may have a second curved surface formed on a lower surface thereof and having the same curvature as that of the first curved surface 120.

Due to the fact that he second curved surface is formed as described above, the unit substrate 100 of the optical device package 10 is disposed on the light transmission member 300 at the same curvature as that of the light transmission member 300. Therefore, when an electrode part is connected to the lower surface of the unit substrate 100, the electrode part is easily connected to the optical device package 10 by providing the electrode part having an overall curved shape.

In other words, the light transmission member 300, the upper surface of the optical device package 10 (that is, the upper surface of the unit substrate 100), and the lower surface of the optical device package 10 (that is, the lower surface of the unit substrate 100) all have a curved shape with a predetermined curvature. Therefore, when the optical device package 10, the light transmission member 300, and the electrode part are all combined, it is possible to easily maintain the overall shape in a curved shape.

Optical Device Package 10' According to a Second Embodiment of the Present Invention Hereinbelow, an optical device package 10' according to a second embodiment of the present invention will be described with reference to FIGS. 4 to 6.

Figure 5B:
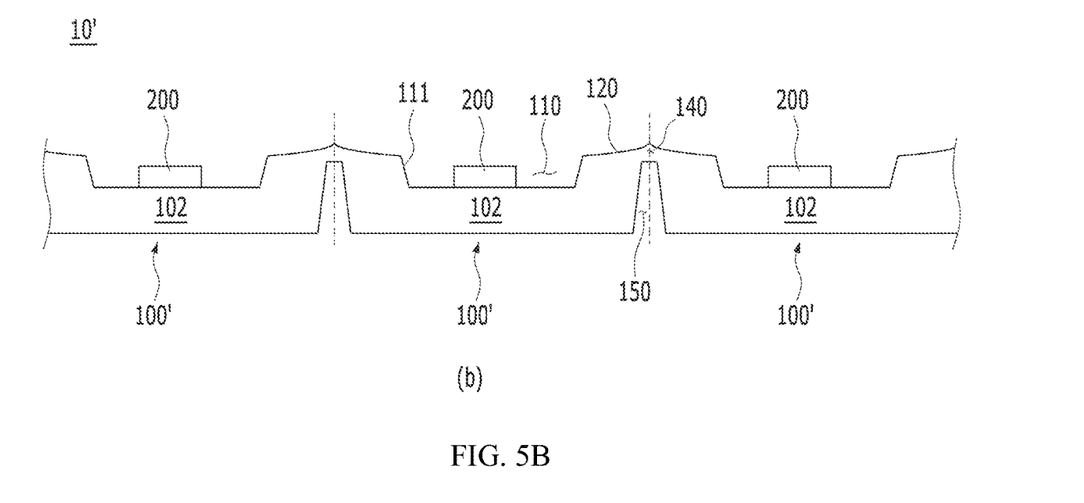
FIG. 5B is a sectional view taken along a Y-axis of the optical device package of FIG. 4.
Figure 6:
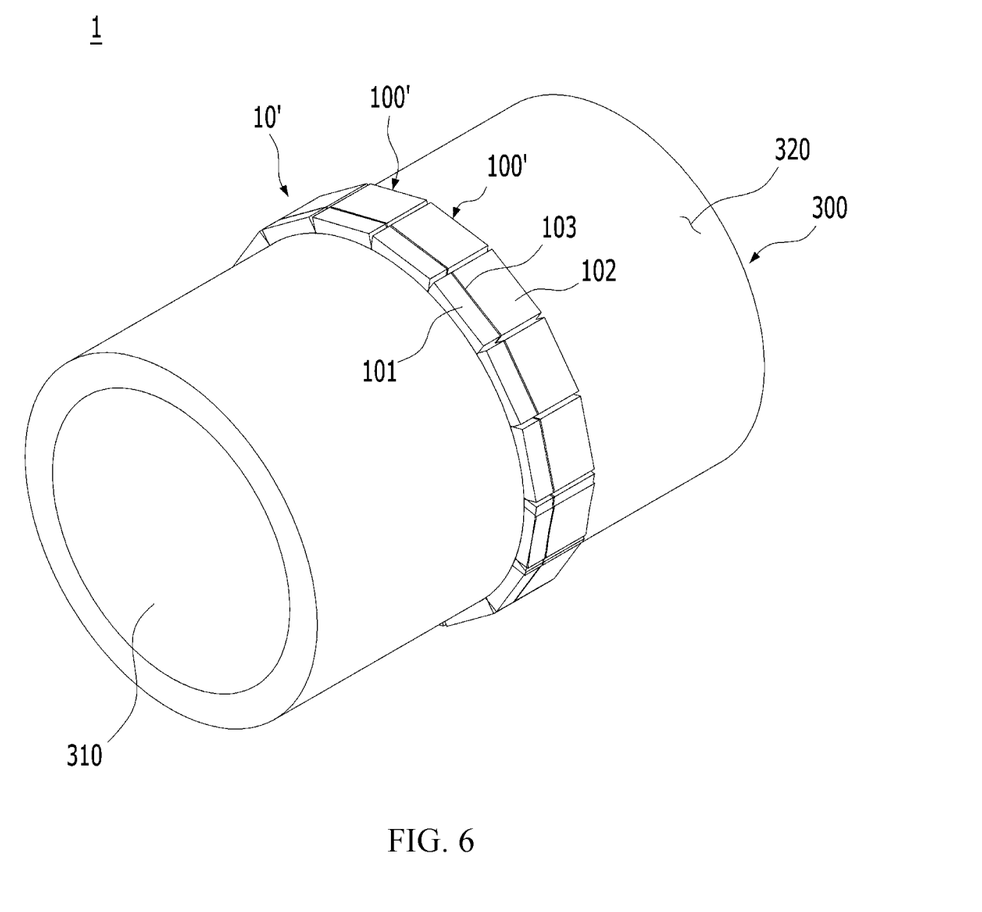
FIG. 6 is a perspective view illustrating that the optical device package of FIG. 4 is bonded to a light transmission member having a curved surface.

FIG. 4 is a perspective view illustrating that an optical device is mounted on an optical device package according to a second embodiment of the present invention, FIG. 5A is a sectional view taken along an X-axis of the optical device package of FIG. 4, FIG. 5B is a sectional view taken along a Y-axis of the optical device package of FIG. 4, and FIG. 6 is a perspective view illustrating that the optical device package of FIG. 4 is bonded to a light transmission member having a curved surface.

As illustrated in FIGS. 4, 5A, and 5B, the optical device package 10' according to the second embodiment of the present invention includes: a unit substrate 100' having first and second metal substrates 101 and 102 that are bonded together on side surfaces thereof in a horizontal direction, and a vertical insulating layer 103 provided between the first and second metal substrates 101 and 102 so as to electrically insulate the first and second metal substrates 101 and 102 from each other; a cavity 110 provided in an upper surface of the unit substrate 100'; and a first curved surface 120 provided on the upper surface of the unit substrate 100', wherein multiple unit substrates 100' are connected to each other, and each of junctions 140 provided between the multiple unit substrates 100' has a groove 150 that is formed in a lower surface of the unit substrate 100' to be open downward.

The optical device package 10' according to the second embodiment of the present invention differs from the optical device package 10 according to the first embodiment only in that the multiple unit substrates 100' are connected to each other by the junctions 140, but the remaining components are the same. Therefore, a repetitive description of the same components will be omitted.

The multiple unit substrates 100' of the optical device package 10' are connected to each other, and the junctions 140 are provided between the multiple unit substrates 100'. Furthermore, the grooves 150 are formed at lower sides of the junctions 140, that is, in a lower surface of the optical device package 10'.

Due to the fact that the grooves 150 are formed in the lower surface of the optical device package 10', the grooves 150 function to facilitate rolling of the multiple unit substrates 100' when the unit substrates 100' are rolled as illustrated in FIGS. 4 and 6. In this case, it is preferable that the grooves 150 are formed in directions perpendicular to first curved surfaces 120.

Referring to FIGS. 5A and 5B, the first curved surface 120 are provided parallel to the Y-axis direction as illustrated in FIG. 5B.

On the other hand, the grooves 150 are configured such that longitudinal directions thereof are parallel to the X-axis direction as illustrated in FIG. 4.

Due to the fact that the first curved surfaces 120 and the grooves 150 are provided in directions perpendicular to each other as described above, as illustrated in FIG. 6, when the multiple unit substrates 100' are bonded to an outer surface of a light transmission member 300 by being arranged along a circumferential direction thereof, the grooves 150 easily perform the function of facilitate the rolling of the multiple unit substrates 100'.

Hereinbelow, one example of a manufacturing method of the optical device package 10' according to the second embodiment of the present invention will be described.

It is to be noted that a metal substrate referred to in the following description is a substrate before unit substrates 100' are cut or divided into predetermined units, that is, a substrate in which multiple first and second metal substrates 101 and 102 that are bonded together by vertical insulating layers 103 are arranged. In this case, a direction from the left side to the right side of the metal substrate is an X-axis direction, and a direction from the front side to the rear side is a Y-axis direction.

First, the metal substrate having the multiple first and second metal substrates 101 and 102 bonded together by the vertical insulating layers 103 is prepared. In this case, the vertical insulating layers 103 are configured such that longitudinal directions thereof are parallel to the X axis. In other words, the first and second metal substrates 101 and 102 are bonded to each other in a front-and-rear direction with the vertical insulating layers interposed between the first and second metal substrates 101 and 102 bonded together.

Thereafter, an upper surface of the metal substrate is formed to have first curved surfaces 120 having the same curvature as that of a curved surface 320 of a light transmission member 300. In this case, the number of the first curved surfaces 120 is equal to the number of the unit substrates 100' each constituted by bonding of a first metal substrate 101, a second metal substrate 102, and a vertical insulating layer 103.

The upper surface of the metal substrate is formed to have cavities 110 so as to be located at the centers of the first curved surfaces 120.

Furthermore, a lower surface of the metal substrate is formed to have grooves 150. In this case, the grooves 150 are formed to define boundaries between the unit substrates 100'.

The grooves 150 are formed such that the multiple unit substrates 100' remain connected to each other. Therefore, junctions 140 are formed at upper sides of the grooves 150.

After the first curved surfaces 120, the cavities 110, and the grooves 150 are formed on the metal substrate, the metal substrate is cut along a plane perpendicular to the Y-axis. Thereafter, forming of the optical device package 10' according to the second embodiment as illustrated in FIG. 4 is completed.

Furthermore, before cutting the metal substrate, an optical device 200 may be mounted on each of the cavities 110 of one unit substrate 100', and a wire (not shown) may be connected thereto.

The optical device package 10' according to the second embodiment of the present invention having the above-described configuration has the following effects in addition to the effects of the optical device package 10 according to the first embodiment described above.

When the optical device package 10' is provided on the curved surface 320 of the light transmission member 300, the multiple unit substrates 100' are connected to each other by the junctions 140, while the grooves 150 help the optical device package 10' rolled in an overall circular shape to correspond to the shape of the curved surface 320 of the light transmission member 300. Therefore, the multiple unit substrates 100' are bonded to the light transmission member 300 in surface contact with the curved surface 320 of the light transmission member 300 in a state of being connected to each other. This makes it possible to bond a large number of unit substrates 100' to the light transmission member 300 as compared with the first embodiment of the present invention.

Furthermore, due to the fact that the multiple unit substrates 100' are connected to each other, it is possible to achieve a strong bonding with the light transmission member 300.

The first curved surfaces 120 of the multiple unit substrates 100' are formed such that each of the first curved surfaces is formed on the upper surface of each of the multiple unit substrates 100'.

In this case, as illustrated in FIGS. 4 to 6, the first curved surface 120 is convex downwardly of the unit substrate 100', such that the optical device package 10' is bonded to the outer surface of the light transmission member 300.

Furthermore, as described in the first embodiment of the present invention, the first curved surface 120 may be formed to be convex upwardly of the unit substrate 100' such that the optical device package 10' is bonded to the inner surface of the light transmission member 300.

In the optical device package 10' according to the second embodiment of the present invention, each of the multiple unit substrates 100' has a second curved surface formed on a lower surface thereof like the optical device package 10 according to the first embodiment of the present invention, and a description thereof can be substituted for the above and thus will be omitted.

As described above, the present invention has been described with reference to the exemplary embodiments. However, those skilled in the art will appreciate that various modifications, additions and substitutions are possible, without departing from the scope and spirit of the invention as disclosed in the accompanying claims.

What is claimed is:

1. An optical device package that is capable of being bonded to a light transmission member having a curved surface, the optical device package comprising:
   a unit substrate including first and second metal substrates provided adjacent to each other, and a vertical insulating layer provided between the first and second metal substrates so as to electrically insulate the first and second metal substrates from each other;
   a cavity depressed downward in an upper surface of the unit substrate, and
   a first curved surface shaped to be convex downward on the upper surface of the unit substrate and coming into surface contact with the curved surface of the light transmission member.

2. The optical device package of claim 1, wherein the unit substrate has a second curved surface provided on a lower surface thereof and having the same curvature as a curvature of the first curved surface.

3. The optical device package of claim 1, wherein the cavity is disposed such that a center point thereof is located on a center point of the first curved surface.

4. An optical device package that is capable of being bonded to a light transmission member having a curved surface, the optical device package comprising:
   a unit substrate including first and second metal substrates that are bonded together on side surfaces thereof in a horizontal direction, a vertical insulating layer provided between the first and second metal substrates so as to electrically insulate the first and second metal substrates from each other, and a first curved surface provided on an upper surface thereof and coming into surface contact with the light transmission member; and
   a cavity provided in the upper surface of the unit substrate,
   wherein multiple unit substrates are connected to each other, and each of junctions between the multiple unit substrates has a groove that is formed in a lower surface of the unit substrate to be open downward.

* * * * *